(12) United States Patent
Zhang

(10) Patent No.: US 10,863,654 B1
(45) Date of Patent: Dec. 8, 2020

(54) DISPLAY DEVICE

(71) Applicant: WUHAN CHINA STAR OPTOELECTRONICS TECHNOLOGY CO., LTD., Hubei (CN)

(72) Inventor: Wei Zhang, Hubei (CN)

(73) Assignee: Wuhan China Star Optoelectronics Technology Co., Ltd., Hubei (CN)

( * ) Notice: Subject to any disclaimer, the term of this patent is extended or adjusted under 35 U.S.C. 154(b) by 0 days.

(21) Appl. No.: 16/612,421

(22) PCT Filed: Sep. 20, 2019

(86) PCT No.: PCT/CN2019/106898
§ 371 (c)(1),
(2) Date: Nov. 11, 2019

(51) Int. Cl.
*H05K 7/20* (2006.01)
*H05K 1/18* (2006.01)
*H04M 1/02* (2006.01)

(52) U.S. Cl.
CPC ...... *H05K 7/20963* (2013.01); *H04M 1/0266* (2013.01); *H05K 1/189* (2013.01); *H05K 2201/056* (2013.01); *H05K 2201/10128* (2013.01)

(58) Field of Classification Search
CPC .. H05K 1/189; H05K 7/2039; H05K 7/20854; H05K 7/209; H05K 7/20954; H05K 7/20963; H05K 2201/056; H05K 2201/10128; H04M 1/0266
See application file for complete search history.

(56) References Cited

U.S. PATENT DOCUMENTS

| 10,551,886 | B1* | 2/2020 | de la Fuente | H05K 7/20963 |
| 2009/0291609 | A1* | 11/2009 | Kim | H05K 7/20427 |
| | | | | 445/24 |
| 2014/0204535 | A1* | 7/2014 | Byun | H01L 23/3737 |
| | | | | 361/704 |
| 2014/0334104 | A1* | 11/2014 | Yang | H05K 7/20854 |
| | | | | 361/709 |
| 2015/0075186 | A1* | 3/2015 | Prajapati | F25B 21/02 |
| | | | | 62/3.7 |
| 2015/0252241 | A1* | 9/2015 | Jang | B82Y 30/00 |
| | | | | 252/74 |
| 2016/0357079 | A1* | 12/2016 | Chen | G06F 3/0412 |
| 2016/0370133 | A1* | 12/2016 | Liu | B32B 15/20 |
| 2017/0099736 | A1* | 4/2017 | Jung | G02F 1/13452 |
| 2017/0115074 | A1* | 4/2017 | Cheng | F28F 13/18 |
| 2018/0375055 | A1* | 12/2018 | Tu | H05K 7/20963 |
| 2019/0168486 | A1* | 6/2019 | Min | B32B 38/0036 |
| 2020/0165503 | A1* | 5/2020 | Borini | F28F 21/02 |

* cited by examiner

*Primary Examiner* — Jacob R Crum
(74) *Attorney, Agent, or Firm* — Mark M. Friedman

(57) ABSTRACT

The present invention provides a display device. The display device includes a display module and a heat dissipation layer. The display module has a display surface. The heat dissipation layer is attached to one side of the display module away from the display surface. The heat dissipation layer adopts a new structure and solves a delamination problem which may occur when a flip-chip film is peeled off from the heat dissipation layer.

12 Claims, 4 Drawing Sheets

DISPLAY DEVICE

FIELD OF DISCLOSURE

The present invention relates to a field of display devices and in particular, to a display device.

DESCRIPTION OF RELATED ART

Due to the development of electronic products, there has been a trend toward miniaturization, high speed, and a large number of pins, integrated circuit (IC) packaging technology is also advanced toward this trend, and the driver ICs in liquid crystal displays (LCDs) are no exception. At present, liquid crystal displays require high resolution and flatness, and a narrow bezel or even a bezel-free design, so a chip-on-film (COF) technology is adopted.

In COF technology, generally a chip is turned face-down and bonded to a display module through a metal conductor. When a flexible substrate is used, the chip can be fixed on a film, and the chip is electrically connected to the flexible substrate by means of the metal conductor only, which is called COF technology.

In conventional COF structures, an IC chip is bonded to a flexible circuit board, and then the flexible circuit board is folded to a back of a display surface of a liquid crystal display module. Since the IC chip generates a large amount of heat, there is also a large amount of heat in a back of the liquid crystal display module with the COF structures.

In conventional COF designs, as shown in FIG. 1, a heat dissipation layer 30 is disposed between a flip-chip film 20 and a liquid crystal display module 10. However, the heat dissipation layer 30 is constituted by single-layer graphite. After the flip-chip film 20 is peeled off the graphite heat dissipation layer 30, the graphite heat dissipation layer 30 may have problems such as delamination, which seriously affects heat dissipation after repair/maintenance.

The above paragraphs regarding conventional techniques are only intended to aid in understanding the present invention, and thus the above-mentioned content may include some techniques that are not known to those of ordinary skill in the art. In addition, the content does not represent problems to be solved by one or more embodiments of the present invention, nor does it represent that the present invention is known to a person having ordinary knowledge in the field before filing of the present invention.

SUMMARY

It is an objective of the present invention to provide a display device for solving a problem in conventional techniques. The problem is that a heat dissipation layer delaminates after a flip-chip film is peeled off from the heat dissipation layer, which seriously affects heat dissipation after repair/maintenance.

Accordingly, the present invention provides a display device. The display device comprises a display module and a heat dissipation layer. The display module comprises a display surface. The heat dissipation layer is attached to one side of the display module away from the display surface.

The heat dissipation layer comprises a first heat dissipation region, a second heat dissipation region, a first heat dissipation material layer, and a second heat dissipation material layer. The first heat dissipation material layer is extended from the first heat dissipation region to the second heat dissipation region, and the second heat dissipation material layer is disposed on the first heat dissipation material layer in the second heat dissipation region.

The display device further comprises a flip-chip film. The flip-chip film comprises a flexible printed circuit board and an integrated circuit (IC) chip. One end of the flexible printed circuit board is connected to the display module. The IC chip is fixed to a surface of the flexible printed circuit board facing the display module, wherein the IC chip is disposed on the first heat dissipation region, and the second heat dissipation material layer faces the flip-chip film.

The flip-chip film comprises an adhesive layer. The adhesive layer is disposed on the flip-chip film and the first heat dissipation region of the heat dissipation layer.

An area of the IC chip is less than an area of the first heat dissipation region.

Moreover, the first heat dissipation material layer is made of copper, and the second heat dissipation material layer is made of graphene.

A thickness of the heat dissipation layer ranges from 50 um to 100 um.

A thickness of the heat dissipation layer in the first heat dissipation region is equal to a thickness of the heat dissipation layer in the second heat dissipation region.

In the second heat dissipation region, a thickness of the second heat dissipation material layer is less than a thickness of the first heat dissipation material layer.

In the first heat dissipation region, a thickness of the first heat dissipation material layer is 75 um. In the second heat dissipation region, the thickness of the first heat dissipation material layer is 50 um, and the thickness of the second heat dissipation material layer is 25 um.

The flip-chip film further comprises at least two buffer portions disposed at two sides of the IC chip.

Advantages of the Present Invention

In the display device of the present invention, the heat dissipation layer attached between the flip-chip film and the display module is divided into regions, and the heat dissipation layer in the first heat dissipation region arranged corresponding to the IC chip is a single-layer structure made of copper which is resistant to tearing. Copper has superior ductility compared to graphene in prior art, so when the flip-chip film is peeled off the heat dissipation layer, the heat dissipation layer does not delaminate, and as a result, heat dissipation of the heat dissipation layer is not affected after repair/maintenance. The heat dissipation layer in the second heat dissipation region facing the flip-chip film is configured to be a two-layer structure. A layer of the two-layer structure adjacent to the display module is made of copper while the other layer of the two-layer structure adjacent to the flip-chip film is made of graphene, thereby preventing the heat dissipation layer from delamination when the flip-chip film is peeled off, and at the same time, ensuring good heat dissipation of the heat dissipation layer.

BRIEF DESCRIPTION OF DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without an inventive work or paying the premise.

DETAILED DESCRIPTION OF EMBODIMENTS

Figure 1:
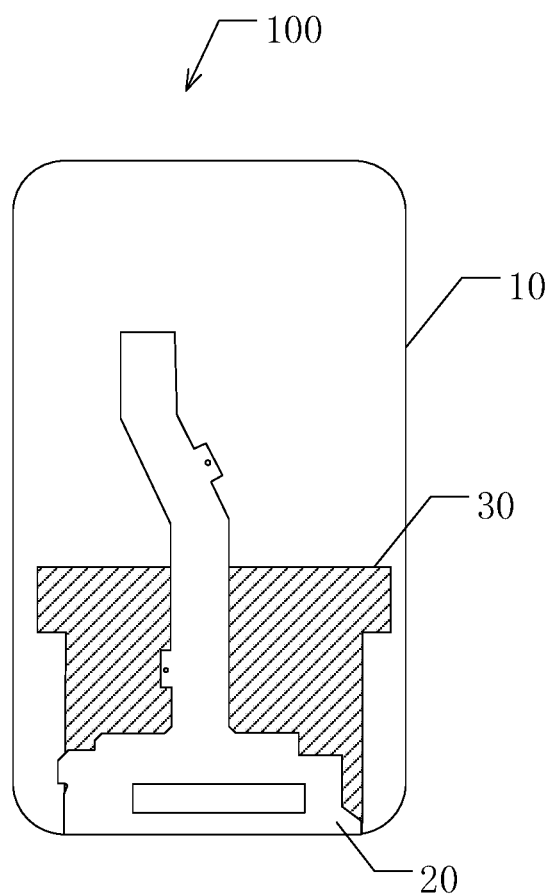
FIG. 1 is a schematic structural view illustrating a conventional display device.

Embodiments of the present invention will be described below with reference to the accompanying drawings. The following description is provided to describe implementation of the present invention for ease of understanding of those skilled in the art. The present invention can be embodied in many different forms according to various embodiments of the invention, and the protection scope of the invention is not limited to the embodiments listed in the present disclosure.

In the drawings, structurally identical components are denoted by the same reference numerals, and structural or functionally similar components are denoted by like reference numerals. The dimensions and thickness of each component shown in the drawings are illustrative, and the invention does not limit the size and thickness of each component. In order to make the illustration clear, thicknesses of some parts have been exaggerated in the accompanying drawings.

In addition, the following description of the various embodiments of the present invention is intended to be illustrative. Directional terms mentioned in the present invention, such as "upper", "lower", "front", "back", "left", "right", "inside", "outside", "side", are used to describe and better understand the present invention, and do not indicate or imply that a device or component referred to must have a particular orientation or be operated in a particular orientation. The directional terms are therefore not to be construed as limiting the invention. Moreover, the terms "first", "second", "third", and the like are used for descriptive purposes only and are not to be construed as indicating or implying relative importance.

When a component is described as being "on" another component, the component can be placed directly on another component; or alternatively, an intermediate component can also be present therebetween, the component is placed on the intermediate component, and the intermediate part is placed on another part. When a component is described as "mounted to" or "connected to" another component, it can be understood as "directly mounted to" or "directly connected to" another component; or alternatively, "mounted to" or "coupled to" another component through an intermediate component.

Figure 2:
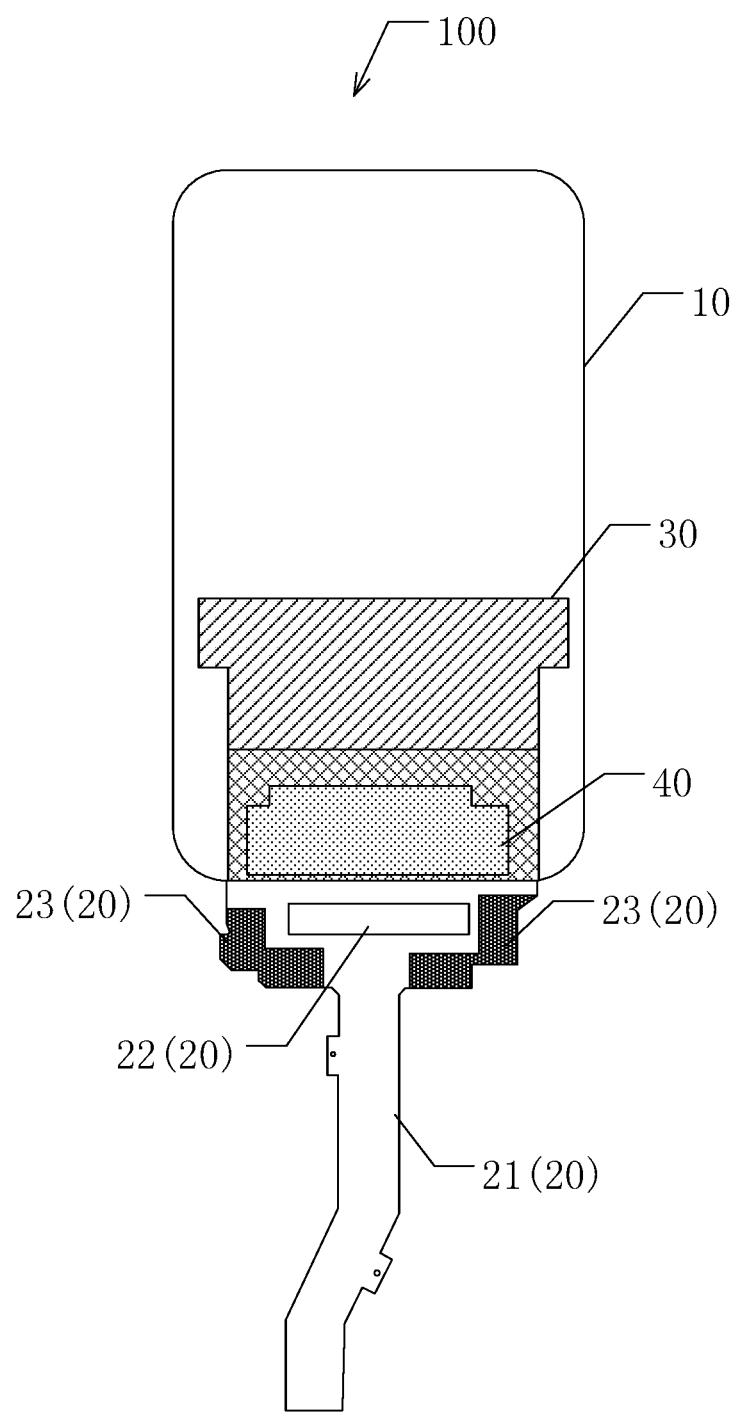
FIG. 2 is a schematic structural view illustrating a display device before a flip-chip film is folded according to one embodiment of the present invention.

Referring to FIG. 2, according to one embodiment of the present invention, a display device 100 is provided. The display device 100 comprises a display module 10, a heat dissipation layer 30, and a flip-chip film 20.

The display module 10 comprises display parts such as a display panel and a backlight module. The display module 10 has a display surface configured to display images. The display panel can be a liquid crystal display (LCD), a light emitting diode (LED), or an organic light-emitting diode (OLED). The backlight module is configured to provide backlight to the display panel. As some kinds of display panels cannot emit light by themselves, it is necessary to provide the backlight module to provide a light source for the display panel, and to make the display panel emit light. The backlight module generally comprises a backlight source and a backlight plate. There are mainly three types of backlight source, i.e. an electroluminescent (EL) lamp, a cold cathode fluorescent lamp (CCFL), and a light emitting diode (LED). According to different positions of light sources, the backlight source is categorized into an edge-lit type and a direct-lit type. Different types of backlights and different positions of light sources can be chosen according to various needs. The backlight plate includes one or more of a reflective sheet, a light guide plate, a diffusion sheet, a brightness enhancement sheet, and other suitable optical film. The backlight plate with multi-layered optical films improves angular light distribution and guide light scattering directions, causes uniform light illumination, and concentrates the light to a front view angle, thereby reducing a loss of the light and increases brightness of the display module 10 in an axial direction.

The flip-chip film 20 comprises an integrated circuit (IC) chip 22 and a flexible printed circuit board (FPC) 21. The IC chip 22 is fixed to a surface of the flexible printed circuit board 21 facing the display module 10. The IC chip 22 includes a source driver and a gate driver for achieving a display function. The flexible printed circuit board 21 has multiple leads inside. The IC chip 22 is fixed to the flexible printed circuit board 21 by using a bonding technique and connected to the display module 10. In a driving circuit, one end of the flip-chip film 20 is connected to the display module 10, so that data signals output from the IC chip 22 can be transmitted to the display module 10 to control the display module to display images. The flip-chip film 20 further comprises two buffer portions 23 disposed at two sides of the IC chip 22 and arranged corresponding to each other. The buffer portions 23 serve to protect the IC chip 22 to prevent the IC chip 22 from collision and damage during installation and transportation.

Figure 3:
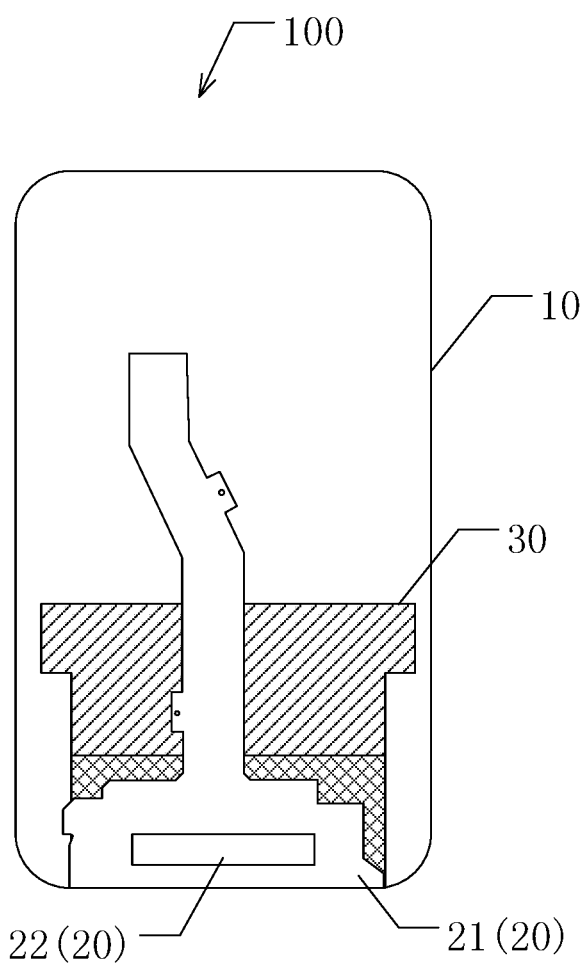
FIG. 3 is a schematic structural view illustrating the display device after the flip-chip film is folded according to one embodiment of the present invention.

The heat dissipation layer 30 is attached to one side of the display module 10 away from the display surface. A thickness of the heat dissipation layer 30 ranges from 50 um to 100 um. As shown in FIG. 3, the flip-chip film 20 is attached to a surface of the heat dissipation layer 30 away from the display module 10. The heat dissipation layer 30 is configured to dissipate heat of the flip-chip film 20 and the display module 10.

Figure 4:
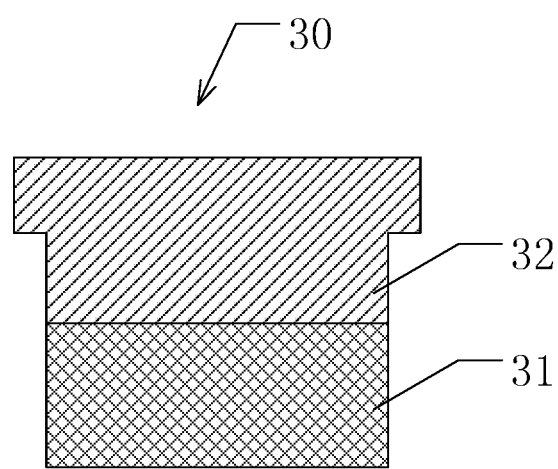
FIG. 4 is a schematic structural view illustrating a heat dissipation layer according to one embodiment of the present invention.

As shown in FIG. 4, the heat dissipation layer 30 comprises a first heat dissipation region 31 and a second heat dissipation region 32. An edge of the first heat dissipation region 31 is connected to an edge of the second heat dissipation region 32. A thickness of the heat dissipation layer 30 in the first heat dissipation region 31 is the same as a thickness of the heat dissipation layer 30 in the second heat dissipation region 32. In the present embodiment, the heat dissipation layer 30 in the first heat dissipation region 31 and the heat dissipation layer 30 in the second heat dissipation region 32 have the same thickness of 75 um.

Figure 5:
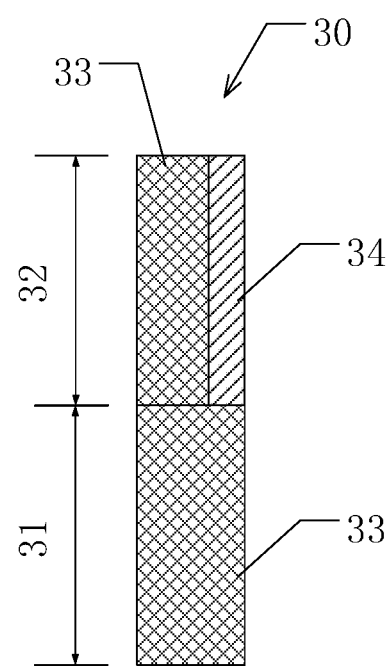
FIG. 5 is a schematic structural view illustrating a layered structure of a second heat dissipation region according to one embodiment of the present invention.

Referring to FIG. 5, the heat dissipation layer 30 further comprises a first heat dissipation material layer 33 and a second heat dissipation material layer 34. The first heat dissipation material layer 33 is extended from the first heat dissipation region 31 to the second heat dissipation region 32. The second heat dissipation material layer 34 is attached onto the first heat dissipation material layer 33 in the second heat dissipation region 32. A thickness of the second heat dissipation material layer 34 is less than a thickness of the first heat dissipation material layer 33. In the present embodiment, a thickness of the heat dissipation layer 30 in the first heat dissipation region 31 is 75 um, and therefore, the thickness of the first heat dissipation material layer 33 is also 75 um. In the second heat dissipation region 32, the thickness of the heat dissipation layer 30 is 75 um, wherein the thickness of the first heat dissipation material layer 33 is 50 um, and the thickness of the second heat dissipation material layer 34 is 25 um. The first heat dissipation material layer 33 is made of copper, and the second heat dissipation material layer 34 is made of graphene. The second heat dissipation region 32 adopts a two-layer combination structure consisting of copper and graphene. The graphene provides excellent heat dissipation but has poor ductility and is prone to delamination. The two-layer combination structure of the second heat dissipation region 32 prevents occurrence of delamination without compromising heat dissipation.

Referring to FIG. 3, the IC chip 22 of the flip-chip film 20 is disposed on a surface of the first heat dissipation region 31 away from the display module 10, and an area of the IC chip 22 is smaller than an area of the first heat dissipation region 31. In the second heat dissipation region 32, the first heat dissipation material layer 33 is disposed on a side of the heat dissipation layer 30 away from the flip-chip film 20, the second heat dissipation material layer 34 is disposed on a side of the heat dissipation layer 30 adjacent to the flip-chip film 20, and the flip-chip film 20 covers a surface of the second heat dissipation material layer 34 away from the first heat dissipation material layer 33.

As shown in FIG. 2, the display device 100 further comprises an adhesive layer 40 disposed between the flip-chip film 20 and the first heat dissipation region 31 of the heat dissipation layer 30 for fixing the flip-chip film 20 onto the heat dissipation layer 30. The heat dissipation layer 30 in the first heat dissipation region 31 is entirely composed of the first heat dissipation material layer 33, and the first heat dissipation material layer 33 is made of copper which has excellent ductility and good heat dissipation capability, so the heat dissipation layer 30 is prevented from delaminating after the flip-chip film 20 is peeled off, and good heat dissipation is ensured at the same time.

In the display device 100 of the present embodiment of the present invention, the heat dissipation layer 30 disposed between the flip-chip film 22 and the display module 10 is divided into regions, and the heat dissipation layer 30 in the first heat dissipation region 31 arranged corresponding to the IC chip 22 is a single layer structure made of copper. Copper has superior ductility compared to graphene in prior art, so when the flip-chip film 20 is peeled off the heat dissipation layer 30, the heat dissipation layer 30 in the first heat dissipation region 31 does not delaminate, and as a result, heat dissipation of the heat dissipation layer 30 is not affected after repair/maintenance.

In addition, in the present embodiment, since graphene has excellent heat dissipation capabilities, the heat dissipation layer 30 in the second heat dissipation region 32 facing the flip-chip film 22 is configured to be a two-layer structure. In the second heat dissipation region 32, a layer of the two-layer structure adjacent to the display module 10 is made of copper while the other layer of the two-layer structure adjacent to the flip-chip film 20 is made of graphene, thereby preventing the heat dissipation layer 30 from delamination when the flip-chip film 20 is peeled off, and at the same time, ensuring good heat dissipation of the heat dissipation layer 30.

The present invention has been described above with reference to specific embodiments. However, it should be understood that these embodiments are merely illustrative of the principles and applications of the invention. It should also be noted that, many modifications may be made to the exemplary embodiments, and other arrangements may be made without departing from the spirit and scope of the present invention as defined by the appended claims. It will be understood that the different dependent claims and the features described herein may be combined in a manner different from that described in the original claims. It will also be appreciated that features described in connection with the individual embodiments can be used in other embodiments.

What is claimed is:

1. A display device, comprising:
   a display module comprising a display surface; and
   a heat dissipation layer attached to one side of the display module away from the display surface, the heat dissipation layer comprising a first heat dissipation region, a second heat dissipation region, a first heat dissipation material layer, and a second heat dissipation material layer, wherein the first heat dissipation material layer extends from the first heat dissipation region to the second heat dissipation region, and the second heat dissipation material layer is disposed on the first heat dissipation material layer in the second heat dissipation region;
   wherein in the first heat dissipation region, a thickness of the first heat dissipation material layer is 75 um; and
   in the second heat dissipation region, the thickness of the first heat dissipation material layer is 50 um, and a thickness of the second heat dissipation material layer is 25 um.

2. The display device according to claim 1, further comprising a flip-chip film, the flip-chip film comprising:
   a flexible printed circuit board, one end of the flexible printed circuit board being connected to the display module; and
   an integrated circuit (IC) chip fixed to a surface of the flexible printed circuit board facing the display module, wherein the IC chip is disposed on the first heat dissipation region, and the second heat dissipation material layer faces the flip-chip film.

3. The display device according to claim 2, further comprising:
   an adhesive layer disposed between the flip-chip film and the first heat dissipation region of the heat dissipation layer.

4. The display device according to claim 2, wherein an area of the IC chip is less than an area of the first heat dissipation region.

5. The display device according to claim 1, wherein the first heat dissipation material layer is made of copper, and the second heat dissipation material layer is made of graphene.

6. The display device according to claim 1, wherein a thickness of the heat dissipation layer ranges from 50 um to 100 um.

7. The display device according to claim 1, wherein a thickness of the heat dissipation layer in the first heat dissipation region is equal to a thickness of the heat dissipation layer in the second heat dissipation region.

8. The display device according to claim 7, wherein in the second heat dissipation region, a thickness of the second heat dissipation material layer is less than a thickness of the first heat dissipation material layer.

9. The display device according to claim 2, wherein the flip-chip film further comprises at least two buffer portions disposed at two sides of the IC chip.

10. A display device, comprising:
a display module comprising a display surface;
a heat dissipation layer attached to one side of the display module away from the display surface, the heat dissipation layer comprising a first heat dissipation region, a second heat dissipation region, a first heat dissipation material layer, and a second heat dissipation material layer, wherein the first heat dissipation material layer extends from the first heat dissipation region to the second heat dissipation region, and the second heat dissipation material layer is disposed on the first heat dissipation material layer in the second heat dissipation region; and
a flip-chip film comprising a flexible printed circuit board and an integrated circuit (IC) chip fixed to a surface of the flexible printed circuit board facing the display module, wherein one end of the flexible printed circuit board being connected to the display module,
wherein when the flip-chip film is bent to be attached to the side of the display module away from the display surface, the IC chip is attached to the first heat dissipation material layer in the first heat dissipation region, and the second heat dissipation material layer faces the flip-chip film.

11. The display device according to claim 10, wherein a thickness of the first heat dissipation material layer in the first heat dissipation region is greater than a thickness of the second heat dissipation material layer in the second heat dissipation region.

12. The display device according to claim 10, wherein an adhesive layer is disposed between the flip-chip film and the first heat dissipation region of the heat dissipation layer, for fixing the flip-chip film onto the heat dissipation layer.

\* \* \* \* \*

UNITED STATES PATENT AND TRADEMARK OFFICE
CERTIFICATE OF CORRECTION

PATENT NO. : 10,863,654 B1
APPLICATION NO. : 16/612421
DATED : December 8, 2020
INVENTOR(S) : Wei Zhang Page 1 of 1

It is certified that error appears in the above-identified patent and that said Letters Patent is hereby corrected as shown below:

On the Title Page

Item (30) Foreign Application Priority Data:
Add "June 13, 2019 (CN) 201910511861.9"

Signed and Sealed this
Thirteenth Day of April, 2021

Drew Hirshfeld
*Performing the Functions and Duties of the*
*Under Secretary of Commerce for Intellectual Property and*
*Director of the United States Patent and Trademark Office*